United States Patent [19]

Hattori

[11] Patent Number: 5,072,267
[45] Date of Patent: Dec. 10, 1991

[54] COMPLEMENTARY FIELD EFFECT TRANSISTOR

[75] Inventor: Masayuki Hattori, Tokyo, Japan
[73] Assignee: NEC Corporation, Japan
[21] Appl. No.: 544,206
[22] Filed: Jun. 26, 1990

[30] Foreign Application Priority Data

Jun. 28, 1989 [JP] Japan ................... 63-167920

[51] Int. Cl.[5] .............. H01L 29/10; H01L 29/78; H01L 29/68; H01L 27/02
[52] U.S. Cl. .................. 357/23.4; 357/23.8; 357/23.14; 357/42; 357/41; 357/44
[58] Field of Search .......... 357/23.4, 23.8, 41, 357/42, 44, 23.14, 86, 89

[56] References Cited

U.S. PATENT DOCUMENTS

| 4,680,604 | 7/1987 | Nakagawa et al. | 357/23.4 |
| 4,694,313 | 9/1987 | Beasom | 357/23.4 |
| 4,698,655 | 10/1987 | Schultz | 357/23.4 |
| 4,823,173 | 4/1989 | Beasom | 357/23.8 |
| 4,884,113 | 11/1989 | Muramoto | 357/23.8 |
| 4,928,155 | 5/1990 | Nakagawa et al. | 357/23.4 |
| 4,929,991 | 5/1990 | Blanchard | 357/23.4 |

FOREIGN PATENT DOCUMENTS 62-58683  3/1987  Japan ................... 357/23.8

Primary Examiner—Rolf Hille
Assistant Examiner—Mahshid Saadat
Attorney, Agent, or Firm—Laff, Whitesel, Conte & Saret

[57] ABSTRACT

Complementary field effect transistors are provided wherein double-diffusion MOS FETs including an N-channel and a P-channel are formed on one and the same semiconductor substrate. These two channels are respectively formed in well base regions having the same conductivity type, the well base regions being spaced from each other. A double diffusion P-channel MOS FET has drain regions of the conductivity type which is opposite to the conductivity of a well base region, adjoining a base region of the same conductivity type as the well base region. The P-channel is formed to have a thickness which is less than the thickness of the base region, to thereby realize a diffusion P-channel MOS FET having a short channel.

8 Claims, 4 Drawing Sheets

COMPLEMENTARY FIELD EFFECT TRANSISTOR

BACKGROUND OF THE INVENTION

The present invention relates to a complementary field effect transistor used for a high power integrated circuit (hereinafter referred to as "a power IC") and particularly to a complementary field effect transistor for power which is used for fabricating a power IC necessitating high current and high breakdown voltage, such as a power driver IC for DC motor.

The conventional complementary field effect transistor comprises an N-channel double-diffusion field effect transistor and a P-channel offset gate field effect transistor. Each of the N-channel double-diffusion field effect transistor 31 and the P-channel offset gate field effect transistor 32 is formed in either of the two well base regions which are formed with a given interval on a main surface of a semiconductor substrate. FIG. 1 is a cross section showing an example of a conventional complementary field effect transistor for power driver ICs. In FIG. 1, the N-channel double-diffusion field effect transistor (hereinafter referred to as "N-ch DMOS") comprises a base region 5, a source region 6 formed in the base region 5, a drain region 8, a high concentration drain region 7 formed in the drain region 8, and a first gate poly Si electrode (gate polycrystalline silicon electrode) 11 formed on the semiconductor substrate 20 between the high concentration drain region 7 and the source region 6 through a first gate insulating film 22. Further, in the N-ch DMOS, the base region 5 includes a high concentration base region 4 adjacent to the source region 6. The P-channel offset gate field effect transistor 32 (hereinafter referred to as "P-ch gate MOS") comprises a source region 13, a drain region 15, a high concentration drain region 16 formed in the drain region 15, an offset gate region 12a formed integrally with the drain region 15, and a P-channel gate poly Si electrode 19 formed on the semiconductor substrate 20 between the source region 13 and the high concentration drain region 16 through a second gate insulating film 23, wherein the P-channel gate poly Si electrode is formed in such a shape that a distance between an end of the P-channel gate poly Si electrode 19 and the high concentration drain region 16 is greater than a distance between the other end of the channel gate poly Si electrode 19 and the source region 13.

Further an N-channel source electrode 9 is provided on the source region 6, an N-channel drain electrode 10 is provided on the high concentration drain region 7, a P-channel source electrode 17 is provided on the source region 13, and a P-channel drain electrode 18 is provided on the high concentration drain region 16. Around the N-ch DMOS 31 and the P-ch offset gate MOS 32, a field insulating film 2 is provided, on which an interlayer insulator 21 is provided. Under the field insulating film 2, channel stoppers 3, 3, 3 are provided.

However, in the above conventional complementary field effect transistor, the offset gate structure is unavoidably applied with the present technical level in order to combine a high voltage N-channel transistor and an P-channel transistor into a complementary field effect transistor.

The offset gate region 12a provides a high breakdown voltage, whereas resistor components in the offset gate region 12a contributes to an on-resistance between drain and source. Therefore there is a limit in fabricating a P-channel transistor of low on-resistance. Further it is impossible to obtain short channel effect.

As above-mentioned, in the conventional complementary field effect transistor, P-channel transistor having both high breakdown voltage and low on-resistance cannot be formed. Therefore for implementing a driver IC for DC motor, it is necessary either to form a power transistor of only the N-ch DMOS 31 or to combine the N-ch DMOS 31 with the P-ch offset gate MOS 32. Therefore, in the former case, circuits become intricated, and switching time cannot be shortened above a fixed level. On the other hand, in the latter case, area of the P-ch offset gate MOS 32 becomes exceedingly larger than one of the N-ch DMOS. Therefore cost thereof increases.

SUMMARY OF THE INVENTION

It is an object of the present invention to provide a complementary field effect transistor comprising an N-channel double-diffusion field effect transistor and a P-channel double-diffusion field effect transistor each of which formed in either of the two well base regions of one conductivity type which are formed with a given interval on a main surface of a semiconductor substrate of the opposite conductivity type to the above one conductivity type, wherein said complementary field effect transistor has both high breakdown voltage and low on-resistance, and area of the P-channel MOS does not broaden out as compared with one of the N-channel field effect transistor.

The above object of the present invention is attained by a complementary field effect transistor comprising an N-channel double-diffusion field effect transistor and a P-channel double-diffusion field effect transistor each of which are formed in either of the two well base regions of one conductivity type formed with a given interval on a main surface of a semiconductor substrate of the opposite conductivity type to the above one conduction type, said N-channel double-diffusion field effect transistor comprising a first base region of one conductivity type, an opposite conductivity type first source region formed in said first base region, a first drain region of the opposite conductivity type, an opposite conductivity type first high concentration drain region of the opposite conductivity type formed in said first drain region, and a first gate electrode formed on the semiconductor substrate between said first high concentration drain region and said first source region through a first gate insulating film, and said P-channel double-diffusion transistor field effect transistor comprising a second drain region of the above one conductivity type, a second base region of the opposite conductivity type having a thickness greater than one of said second drain region, a second source region of the above one conductivity type formed in said second base region, a second high concentration drain region of the above one conductivity type formed in said second drain region, and a second gate electrode formed on the semiconductor substrate between said second high concentration drain region and said second source region through a second gate insulating film.

In the present invention, the two well base regions can be of diffusion layers, or the two well base regions can be epitaxial regions of one conductivity type formed on the semiconductor substrate of the opposite conductivity type to the above one conductivity type, said epitaxial regions being separated from each other by a high concentration diffusion isolation region of the opposite conductivity type to the above one conductivity type.

Further, when breakdown voltage between the source region and the drain region is needed to be above 80 V, it is preferable that the first gate insulating film on the first drain region and the first high concentration drain region, and the second gate insulating film on the second drain region and the second high concentration drain region are made thickner than other parts of thereof to such an extent that degradation of breakdown voltage caused by concentration of field around ends of the first and the second gate electrodes can be prevented.

In the present invention, since the P-ch DMOS comprises an one conductivity type second drain region, an opposite conductivity type second base region having a thickness greater than one of the second drain region, an one conductivity type second source region formed in the second base region, a second high concentration drain region formed in the second drain region, and a second gate electrode formed on the semiconductor substrate between the second drain region and the second source region through a second insulating film, a short channel can be formed by double-diffusion of the second source region and the second base region, while existence of the second drain region and the second high concentration drain region provides high breakdown voltage and low on-resistance.

The present invention features that a drain region is deeper than a base region in P-ch DMOS. For example, when a P-conductivity type drain region is formed in an N-conductivity type well base region and further N-conductivity type base region is formed therein by which a channel is formed, that is when the N-conductivity type base region is shallower than the P-conductivity type drain region, the breakdown voltage between the base region and the drain region is determined at a portion at which curvature of the bottom of the base region is large. On the other hand, in the present invention, it is possible to raise the breakdown voltage between the source region and the drain region which has been conventionally in the order of 12 V above 50 V, since the base region is deeper than the drain region, and the curvature is reverse to the curvature in the conventional transistor, and since it is possible to make the drain region a complete depletion layer.

In the present invention, it is preferable that the second base region has a thickness of about 2.0 $\mu$m, and the second drain region has a thickness of about 1.5 $\mu$m.

Further when the drain region exists under the base region, since resistance of this portion is high, a parasitic transistor is easy to become on which results in the destraction. On the other hand, in the present invention, since the drain region does not exist under the base region, therefore no high resistance exist. Therefore a parasitic transistor is difficult to be formed. Accordingly fully high breakdown voltage is obtained.

Since the complementary field effect transistor according to the present invention has both N-ch DMOS with high breakdown voltage and low on-resistance and P-ch DMOS with high breakdown voltage, a power IC for motor drive of high performance can be implemented, therefore good results being obtained.

DETAILED DESCRIPTION OF THE INVENTION

The present invention will be then explained as examples with reference to the drawings.

Figure 1:
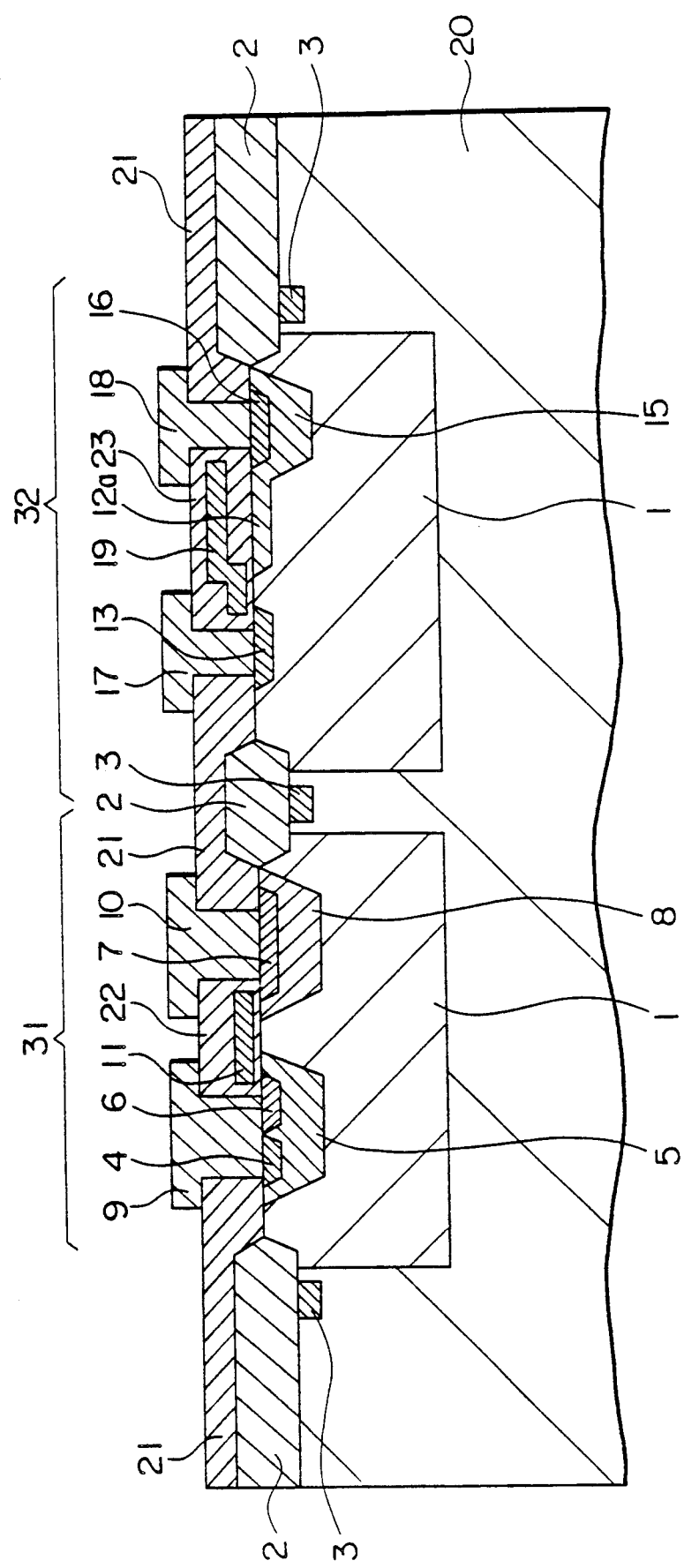
FIG. 1 is a cross section of an example of conventional complementary field effect transistor.
Figure 2:
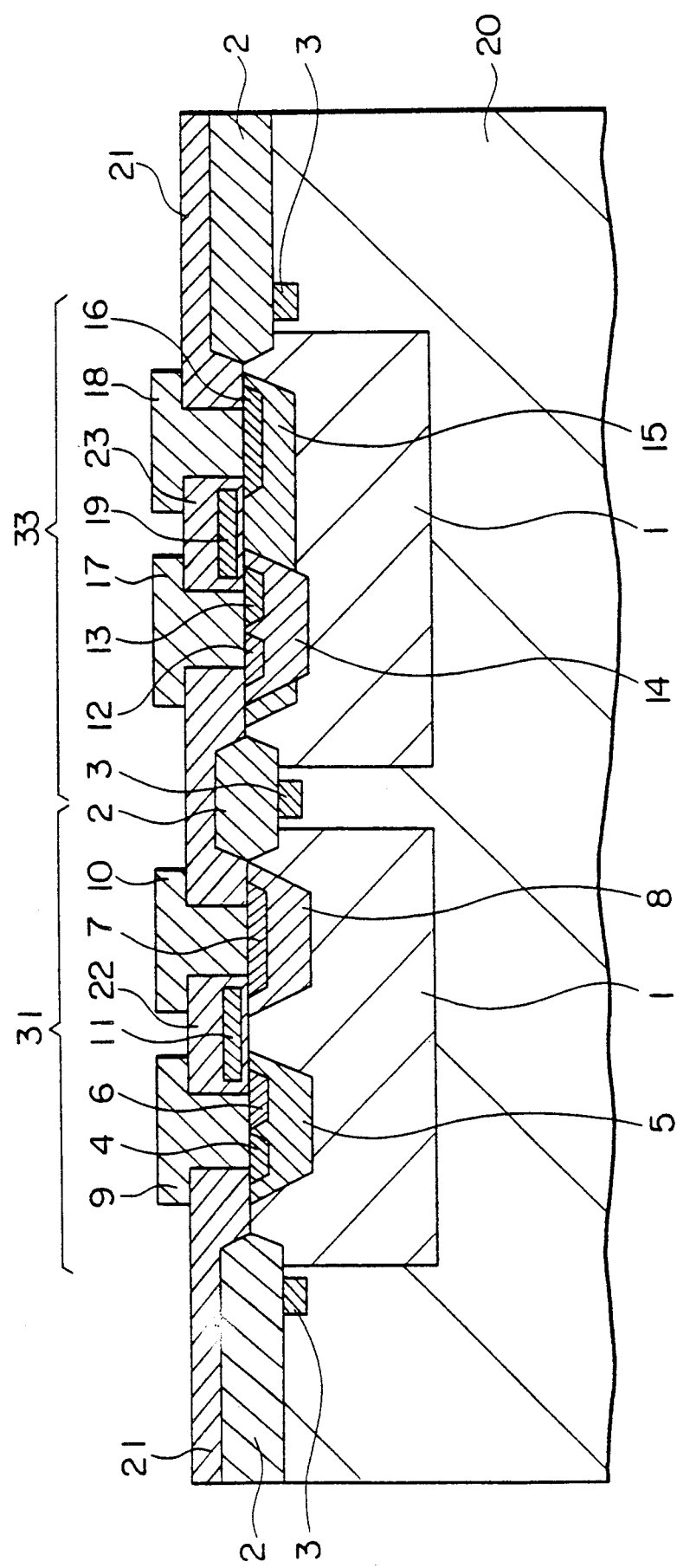
FIG. 2 is a cross section of a first embodiment of the present invention.

FIG. 2 shows a sectional view of the first embodiment of the present invention.

A complementary field effect transistor of the first embodiment of the present invention comprises N-ch DMOS 31 and P-ch DMOS 33 each of which are formed in either of the two N-conductivity type well base regions 1, 1 which are formed with a given interval on a main surface of a P-conductivity type semiconductor substrate 20. The N-ch DMOS 31 comprises a P-conductivity type first base region 5, an N-conductivity type first source region 6 formed in the first base region 5, an N-conductivity type first drain region 8, an N-conductivity type first high concentration drain region 7 formed in the first drain region 8 and an N-ch gate poly Si electrode 11 (an N-channel gate poly polycrystalline silicon electrode) as a first gate electrode formed on the semiconductor substrate between the first high concentration drain region 7 and the first source region 6 through a first gate insulating film 22. Further in the N-ch DMOS, the first base region 5 includes a P-conductivity type first high concentration base region 4 adjacent to the first source region 6. The P-ch DMOS comprises a P-conductivity type second drain region 15, an N-conductivity type second base region 14 having a thickness greater than one of the second drain region 15, a P-conductivity type second source region 13 formed in the second base region 14, a P-conductivity type second high concentration drain region 16, a P-ch gate poly Si electrode 19 (a P-channel gate poly polycrystalline silicon electrode) as a second gate electrode formed on the semiconductor substrate between the second high concentration drain region 16 and the second source region 13 through a second gate insulating film 23. In the second base region 14 of the P-ch DMOS 33, an N-conductivity type second high concentration base region 12 is formed adjacent to the second source region 13.

Further an N-channel source electrode 9 is provided on the first source region 6, an N-channel drain electrode 10 is provided on the first drain region 8, a P-channel source electrode 17 is provided on the second source region 13, and a P-channel drain electrode 18 is provided on the second high concentration drain region 16. Around the N-ch DMOS 31 and the P-ch DMOS 33, a field insulating film 2 is provided, over which an interlayer insulator 21 is provided. Under the field insulating film 2, channel stoppers 3, 3, 3 are provided.

In the present invention, in the N-ch DMOS 31, for example, in the case of an element with breakdown voltage between the source region and the drain region 25 V, the gate poly Si electrode 11 has a length of about 2.5 $\mu$m; the well base regions 1, 1 have a thickness of about 6.0 $\mu$m and surface density thereof is $(6-7) \times 10^{15}$ atm/cm$^2$; the base region 5 has a thickness of about 2 $\mu$m and surface density thereof is $(5-6) \times 10^{17}$ atm/cm$^2$; the N first high concentration base region 4 and the first source region 6 have both a thickness of about 0.5 $\mu$m and a surface density of about $1 \times 10^{20}$ respectively. The first drain region 8 is fabricated together with the second base region 14. The first high concentration drain region 7 is fabricated together with the first source region 6. In order to obtain the P-ch DMOS 33 complementary with the N-ch DMOS 31, the well base region 1 of the P-ch DMOS 33 is formed together with the well base region 1 of the N-ch DMOS 31; the gate poly Si electrode 19 has a length of about 2.5 μm in the same manner as the gate poly Si electrode 11 of the N-ch DMOS 31; the second base region 14 has a thickness of about 2.0 μm and surface density thereof is about $(7-8) \times 10^{17}$ atom/cm$^2$; the surface density changes with threshold voltage of the P-ch DMOS. When the threshold voltage is about −0.8 V, the surface density is $7.5 \times 10^{17}$ atom/cm$^2$ which is obtained under the condition of ion implantations, energy of 70 KeV and the dose of $2.5 \times 10^{13}$ atom/cm$^2$, in ion implantation time of 50 minutes at 1140° C.

The second source region 13 and the second high concentration base region 12 are fabricated together with the first high concentration base region 4 and the first source region 6 of the N-ch DMOS 31, respectively.

Further the second drain region 15 which is characteristic of the present invention has a thickness of about 1.5 μm and surface density thereof is about $(4-8) \times 10^{16}$ atom/cm$^2$. When breakdown voltage between the source region and the drain region is 25 V, surface density of the second drain region 15 is about $6 \times 10^{16}$ atm/cm$^2$, which is obtained under conditions of ion implantation energy of 70 KeV, dose of ion implanted into the P second drain region 15 of $5 \times 10^{12}$ atom/cm$^2$ and ion implantation time of 30 minutes at 1140° C. The second drain region 15 is fabricated in such a shape that the second drain region 15 surrounds the second base region 14. However since the second drain region 15 is shallower than the second base region 14, the second base region 14 passes through the drain region 15 into the well base area 1. The second high concentration drain region 16 is fabricated with the second source region 13.

In the above structure, since the second drain region 15 of high resistance does not exist under the second base region 15, it is possible to supress occurrence of parasitic transistor, thereby breakdown voltage can be obtained in such an extent as the N-ch DMOS.

Further since the degradation of breakdown voltage caused by concentration of field at the corner of the second base region 14 can be prevented. Because the concentration of the drain region can be thus controlled taking no notice of breakdown voltage, it is possible to form short channel in such a manner as the N-ch DMOS, therefore a transistor with high breakdown voltage and low on-resistance can be implemented.

Further, when the drain-to-source breakdown voltage over 80 V is needed, it is necessary to thicken the gate oxide film as compared with other parts thereof over the first drain region 8 and the second drain region 15 as well as over the first high concentration drain region 7 and the second high concentration drain region 16, in order to prevent the degradation of breakdown voltage due to concentration of field at the ends of the first and second gate electrodes. This increases breakdown voltage, and besides the capacity between gate and drain is lowered without $g_m$ of the transistor can be reduced, thereby characteristics of the transistor being improved.

Figure 3:
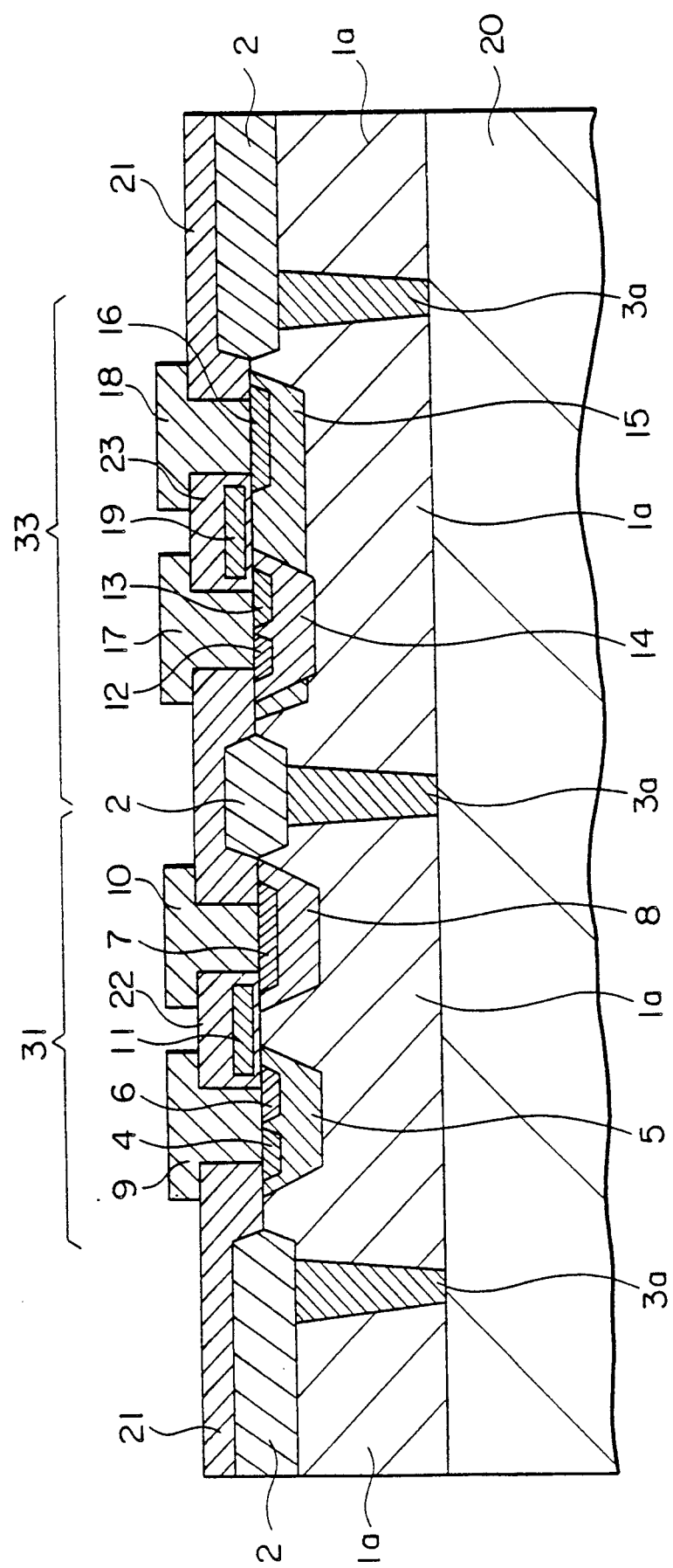
FIG. 3 is a cross section of a second embodiment of the present invention.

FIG. 3 shows a cross section of the second embodiment of the present invention.

The second embodiment has the same structure of elements as the first embodiment. However, isolation of elements thereof differs from one of the first embodiment. The second embodiment is of junction isolation technology. The well base regions 1, 1 are formed by low concentration epitaxial regions 1a, 1a which are separated from each other by high concentration diffusion isolation region 3a junctioned with the low concentration epitaxial regions 1a, 1a. Thus in the present invention, any method of isolation can be applied.

Figure 4:
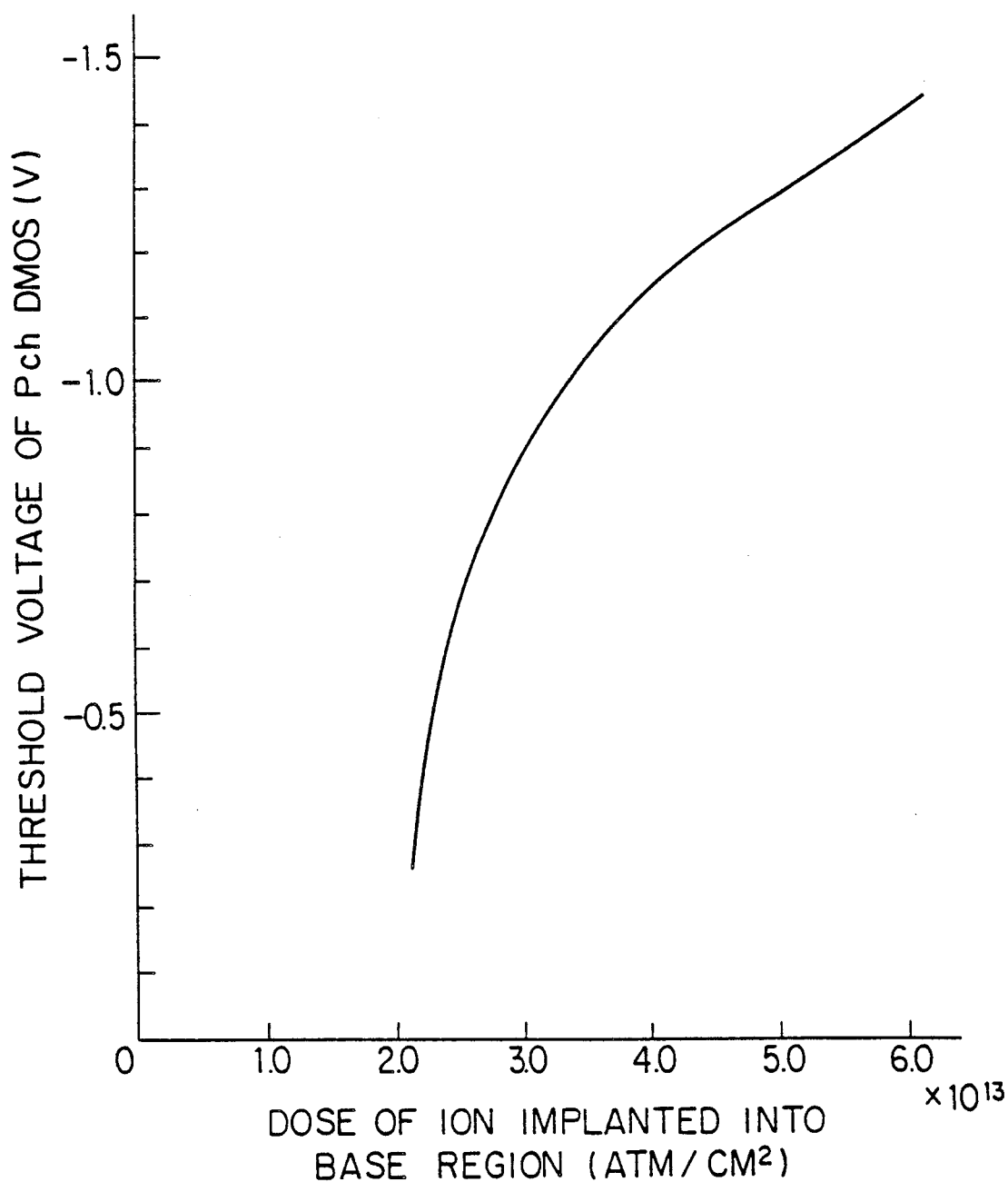
FIG. 4 is a graph of dose of ion implanted into the base to threshold voltage of Pch DMOS.

FIG. 4 shows a relation of dose of ion implanted into the base region to threshold voltage of the Pch DMOS, wherein said relation is obtained with a respect to 300A gate insulating film of the P-ch DMOS.

While there has been herein shown and described the preferred embodiments of the present invention, it is to be understood that said invention may be embodied, otherwise than is herein illustrated and described and that within said embodiment, certain changes in the details of construction, and in the form and arrangement of the parts, may be made without departing from underlying idea or principles of this invention within the scope of the appended claims.

What is claimed is:

1. A complementary field effect transistor comprising an N-channel double-diffusion field effect transistor and a P-channel double-diffusion field effect transistor each of which is formed in a corresponding one of two well base regions of a first conductivity type formed with a given interval on a main surface of a semiconductor substrate of a second conductivity type which is opposite to the first conductivity type, said N-channel double-diffusion field effect transistor comprising a first base region of said second conductivity type, a first source region of said first conductivity type formed in said first base region, a first drain region of said first conductivity type formed in said well base region, a first high concentration drain region, and a first gate electrode formed on the semiconductor substrate between said first high concentration drain region and said first source region through a first gate insulating film, and said P-channel double-diffusion field effect transistor comprising a second drain region of said second conductivity type formed in said well base region, a second base region of said first conductivity type having a thickness which is greater than a thickness of said second drain region, a second source region of said second conductivity type formed in said second base region, a second high concentration drain region of said second conductivity type formed in said second drain region, and a second gate electrode formed on the semiconductor substrate between said second high concentration drain region and said second source region through a second gate insulating film.

2. A complementary field effect transistor as claimed in claim 1 wherein the two well base regions are both diffusion layers.

3. A complementary field effect transistor as claimed in claim 1 wherein the two well base regions comprise epitaxial regions a first conductivity type formed on the semiconductor substrate of the second conductivity type, said epitaxial regions being separated from each other by a high concentration diffusion isolation region of said second conductivity type.

4. A complementary field effect transistor as claimed in claim 1 wherein the first gate insulating film on the first drain region of said first conductivity type and the first high concentration drain region of said first conductivity type, and the second gate insulating film on the second drain region of said second conductivity type and the second high concentration drain region of said second conductivity type are thicker as compared with other parts thereof to such an extent that degradation of breakdown voltage caused by concentration of fields around ends of the first and the second gate electrodes is substantially prevented.

5. A complementary field effect transistor as claimed in claim 1 wherein the second base region has a thickness of about 2.0 μm, and the second drain region has a thickness of about 1.5 μm.

6. A complementary field effect transistor as claimed in claim 1, wherein said first base region, said second drain region, and said second high concentration drain region are of P-conductivity type.

7. A complementary field effect transistor as claimed in claim 1, wherein said first base region includes a first high concentration base region of same conductivity type as said first base region.

8. A complementary field effect transistor as claimed in claim 1, wherein said second base region includes a second high concentration base region of same conductivity type as said second base region.

* * * * *